(12) United States Patent
Terada

(10) Patent No.: US 6,711,086 B2
(45) Date of Patent: Mar. 23, 2004

(54) MULTIPORT SEMICONDUCTOR MEMORY WITH DIFFERENT CURRENT-CARRYING CAPABILITY BETWEEN READ PORTS AND WRITE PORTS

(75) Inventor: Yutaka Terada, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/271,829

(22) Filed: Oct. 15, 2002

(65) Prior Publication Data
US 2003/0076731 A1 Apr. 24, 2003

(30) Foreign Application Priority Data
Oct. 23, 2001 (JP) ........................................ 2001-325537

(51) Int. Cl.⁷ ................................................ G11C 8/16
(52) U.S. Cl. .............................. 365/230.05; 365/189.11; 365/189.04; 365/51; 365/63
(58) Field of Search ....................... 365/230.05, 189.11, 365/51, 63, 189.04

(56) References Cited

U.S. PATENT DOCUMENTS

| 3,813,653 A | * | 5/1974 | Smith et al. ................. 365/227 |
| 5,282,174 A | | 1/1994 | Little ..................... 365/230.05 |
| 6,559,677 B2 | * | 5/2003 | Nitawaki ..................... 326/83 |

* cited by examiner

Primary Examiner—Andrew Q. Tran
(74) Attorney, Agent, or Firm—Merchant & Gould P.C.

(57) ABSTRACT

A semiconductor memory having ports, each of which conducts exclusively a writing or reading operation, by which the access operation can be speeded up when cells at the same row address are accessed simultaneously through two ports. A current-carrying capability of a write access transistor making up a memory cell is lowered relative to a current-carrying capability of a read access transistor within a range capable of finishing the writing operation.

19 Claims, 8 Drawing Sheets

## MULTIPORT SEMICONDUCTOR MEMORY WITH DIFFERENT CURRENT-CARRYING CAPABILITY BETWEEN READ PORTS AND WRITE PORTS

BACKGROUND OF THE INVENTION

1. Field of the Invention

The present invention relates to a multiport semiconductor static memory or static random access memory (hereinafter abbreviated as "SRAM") having multiple input/output terminals for data. More particularly, the present invention relates to a dual-port (2 port) SRAM with ports each exclusive to a read or write operation.

2. Related Background Art

With the development of multimedia equipment, a demand for faster semiconductor devices, especially for faster SRAMs, grows with each passing year. Among various semiconductor memories, the SRAMs are particularly suited for speeding up. Therefore the demand for them is on the increase.

The SRAMs, in general, are classified into a single port type having a single input/output port for data and a multiport type having multiple ports. The multiport SRAMs are used particularly for the purpose of realizing a high transfer rate. Among the multiport SRAMs, dual-port SRAMs having two ports are used often. Since the dual-port SRAMs allow the two ports to operate simultaneously, the dual-port SRAMs are suited for speeding up because twice the transfer rate can be realized during operation compared with a case where a single port SRAM alone is operated. Among the dual-port SRAMs, a 1-Read and 1-Write type configuration is used often, where the function of each port is limited to a write operation or a read operation.

FIG. 8 shows a configuration of a memory cell in an 8-transistor (8 Tr) type dual-port SRAM. One memory cell is configured with eight transistors in total including: two CMOS inverters, each made up of one PMOS transistor and one NMOS transistor; and four access transistors. Such an 8 Tr type is the most commonly used memory cell among the dual-port SRAM memory cells because its cell area can be made small due to the configuration including four access transistors. Note here that the configuration of the inverter is not limited to the CMOS type.

In FIG. 8, memory cells 1a and 1b are each made up of two inverters 4 connected like a ring and constituting a latch functioning as a storage unit in a memory circuit; a pair of write access transistors (NMOS) 2; and a pair of read access transistors (NMOS) 3.

WWL denotes a write word line, RWL denotes a read word line, WBL1 and WBL2 denote a write bit line (positive), /WBL1 and /WBL2 denote a write bit line (negative), RBL1 and RBL2 denote a read bit line (positive) and /RBL1 and /RBL2 denote a read bit line (negative).

SA1 and SA2 are sense amplifiers for amplifying potential differences between the read bit lines RBL1 and /RBL1 and between the read bit lines RBL2 and /RBL2, respectively.

1a and 1b are adjacent memory cells arranged in a row (i.e., in the direction along word lines), which are connected to different bit lines along the column direction (i.e., the direction along bit lines) but are connected to the common read/write word lines in the row direction (i.e., the direction along the word lines WWL and RWL).

Note here that substrate potentials of the access transistors 2 and 3 equal the ground potential VSS unless otherwise specified, and their description in the drawings will be omitted.

An access time of SRAMs is a time period from the input of a control signal from outside to the reading out of the stored data to the outside. In this access time, the reading out of data from memory cells actually is the most time-consuming operation. As for the memory cell 1b conducting the reading operation, a time duration required for activating the read word line RWL and charging the bit lines (RBL2 and /RBL2) with data from the memory cells (data to be read out) occupies a considerable portion of the access time. This is because it takes much time to charge a bit line, which is a relatively long line (i.e., having large load resistance and load capacitance), with the memory cell made up of small transistors, i.e., having a small current-carrying capability. The potential (RD and /RD) output to the bit lines are amplified by a sense amplifier (hereinafter abbreviated as "SA") in the latter stage and then are output to the outside. In this amplifying operation, an error might occur during a reading-out process due to the influence of an offset of the SA, noise on the bit lines and the like. In order to avoid this error, a larger potential is desired for the bit lines when amplifying by means of SAs, and therefore a time duration for obtaining such a large potential is required.

In the case of the dual-port SRAM, however, a problem would occur when adjacent memory cells arranged in a row are accessed through the two ports simultaneously. For instance, as shown in FIG. 8, the memory cell 1a and the memory cell 1b respectively might conduct a writing operation and a reading operation simultaneously. In this case, in order to enable the memory cell 1a to conduct the writing operation, the write word line WWL is activated. Additionally, in order to enable the memory cell 1b to conduct the reading operation, the read word line RWL is activated. However, since both of these word lines WWL and RWL are connected commonly to the memory cells 1a and 1b, these word lines are activated simultaneously for the memory cells 1a and 1b.

A particular problem in this case concerns the read bit lines RBL2 and /RBL2 in the memory cell 1b, which conducts a reading operation. For the inverter latch 4, not only the read bit lines RBL2 and /RBL2 but also the write bit lines WBL2 and /WBL2 function as loads through the two pairs of access transistors, and therefore the load capacitance of the bit lines to be driven becomes twice, which results in the delay in driving the read bit lines RBL2 and /RBL2.

This delay in driving the read bit lines leads to the delay in a timing for driving the SA, which directly results in an increase in the access time.

Note here that the data read out onto the write bit lines WBL2 and /WBL2 in this operation are not used at all, but behave just like pseudo read data (PRD).

Meanwhile, in the memory cell 1a, the write data WD and /WD written by the write access transistor 2 are transferred also to the read bit lines RBL1 and /RBL1 through the read access transistor 3. However, the delay in the write operation does not result from the read bit lines RBL1 and /RBL1, because a write amplifier for driving the write bit lines WBL1 and /WBL1 has a high current-carrying capability.

SUMMARY OF THE INVENTION

Therefore, with the foregoing in mind, it is an object of the present invention to provide a semiconductor memory having ports, each of which conducts exclusively a writing or reading operation, by which the access operation can be speeded up when cells at the same row address are accessed simultaneously through two ports.

The present invention accomplishes the above-stated object by differentiating the access capabilities between the reading operation and the writing operation.

To begin with, the present inventors take note of operating margins in the reading operation and the writing operation. In general, during the writing operation, on inputting data to be written from the outside, address systems can be operated concurrently, and therefore there is a margin of the timing comparatively, and the operation time is not limited by external specifications. Generally speaking, there are no specifications on the writing time. Insofar as the writing operation has been finished within a cycle, the delay in the writing operation is not a problem. Compared with the writing operation, the reading operation is stipulated by the external specifications as an access time that is the most important specification in a memory circuit. Therefore, the reading operation should be conducted on a top-priority basis. In view of these characteristics, the writing operation is intentionally delayed within a range capable of finishing the operation, while a high priority is assigned to the reading operation, whereby the reading operation can be speeded up.

That is to say, between the write access path and the read access path, which are designed equally in the conventional technique, the access time for the write path is delayed relative to that for the read path. Thereby, a load capacitance of the write bit lines is reduced, when considered from the standpoint of the memory cells. As a result, a driving capability for the read bit lines can be increased corresponding to the reduced amount.

More specifically, the following measures may be employed to fulfill the object, where access transistors made up of NMOS transistors are modified in such a manner that:

a gate width of write access transistors is made smaller than that on the reading side;

a gate length of write access transistors is made longer than that on the reading side;

a thickness of a gate oxide film of write access transistors is made larger than that on the reading side;

an ON-state voltage (Vgs) of gates of write access transistors is made smaller than that on the reading side;

a substrate voltage (Vbs) of write access transistors is made smaller than that on the reading side; and a threshold voltage of write access transistors is made higher than that on the reading side In addition, a method for fulfilling the object without modifying the access transistors includes a resistance component of the write path being made larger than that on the reading side.

DETAILED DESCRIPTION OF THE INVENTION

The following describes embodiments of the present invention in detail, with reference to the drawings. Each embodiment deals with an example where the semiconductor memory is a dual-port SRAM.

Embodiment 1

Figure 1:
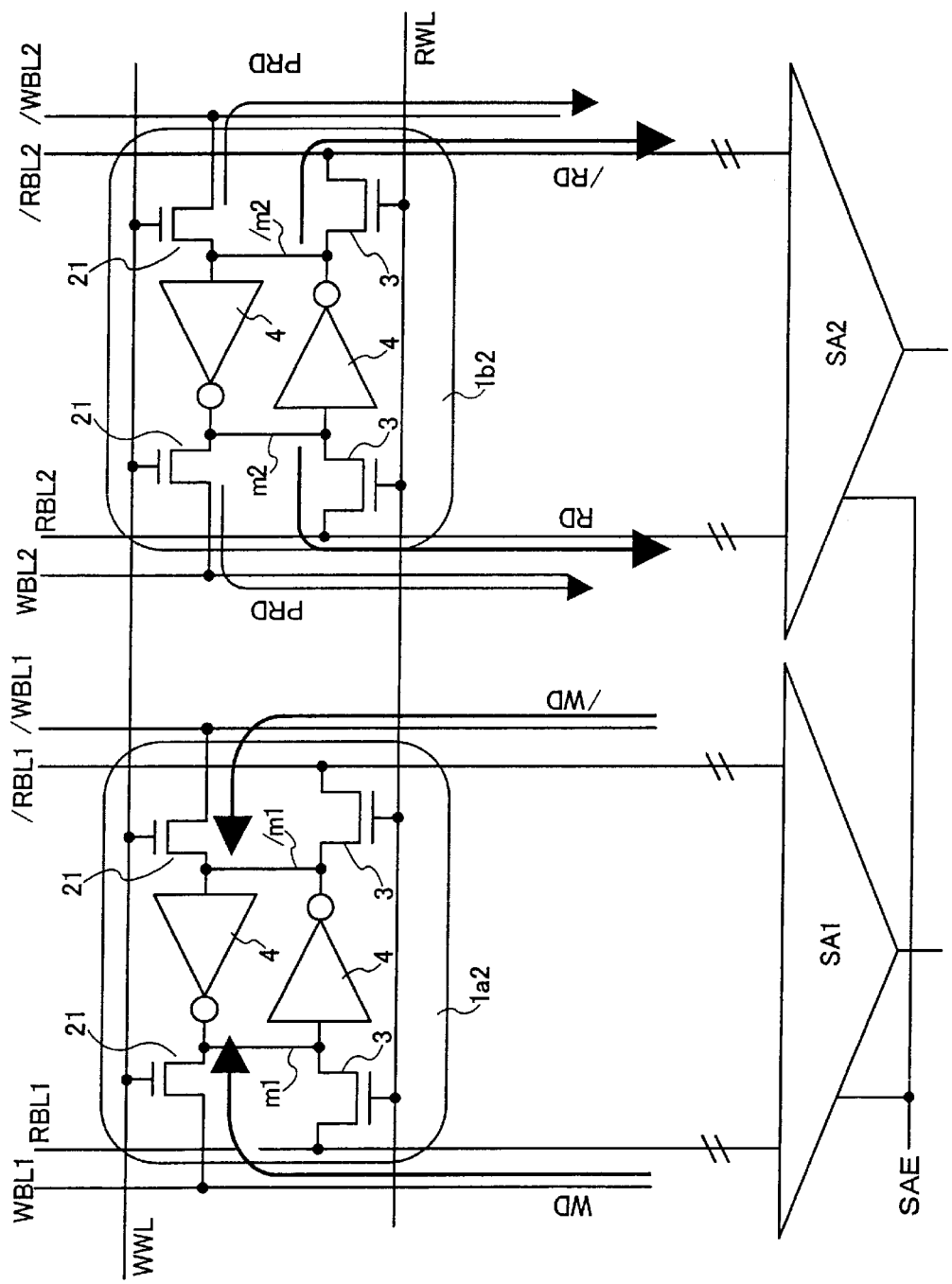
FIG. 1 is a circuit diagram showing a configuration of memory cells in a dual-port SRAM according to Embodiment 1 of the present invention.

FIG. 1 is a circuit diagram showing a configuration of memory cells in a dual-port SRAM according to Embodiment 1 of the present invention.

Memory cells 1a2 and 1b2 are each made up of two inverters 4 connected like a ring, a pair of write access transistors 21 and a pair of read access transistors 3. Notations m1 and /m1, and m2 and /m2 respectively denote output nodes (storage nodes) of inverters 4 in the memory cells 1a2 and 1b2.

WWL denotes a write word line, RWL denotes a read word line, WBL1 and WBL2 denote a write bit line (positive), /WBL1 and /WBL2 denote a write bit line (negative), RBL1 and RBL2 denote a read bit line (positive) and /RBL1 and /RBL2 denote a read bit line (negative). Sense amplifiers SA1 and SA2 are connected between the read bit lines RBL1 and /RBL1 and between the read bit lines RBL2 and /RBL2, respectively.

According to this embodiment, a gate width of the write access transistors 21 is made smaller than that of the read access transistors 3. This configuration allows a current amount flowing through the writing side to be reduced, and allows the difference in the current to be supplied to the reading side. As a result, the capability to drive the read bit lines is enhanced and therefore the reading operation can be speeded up.

Figure 2:
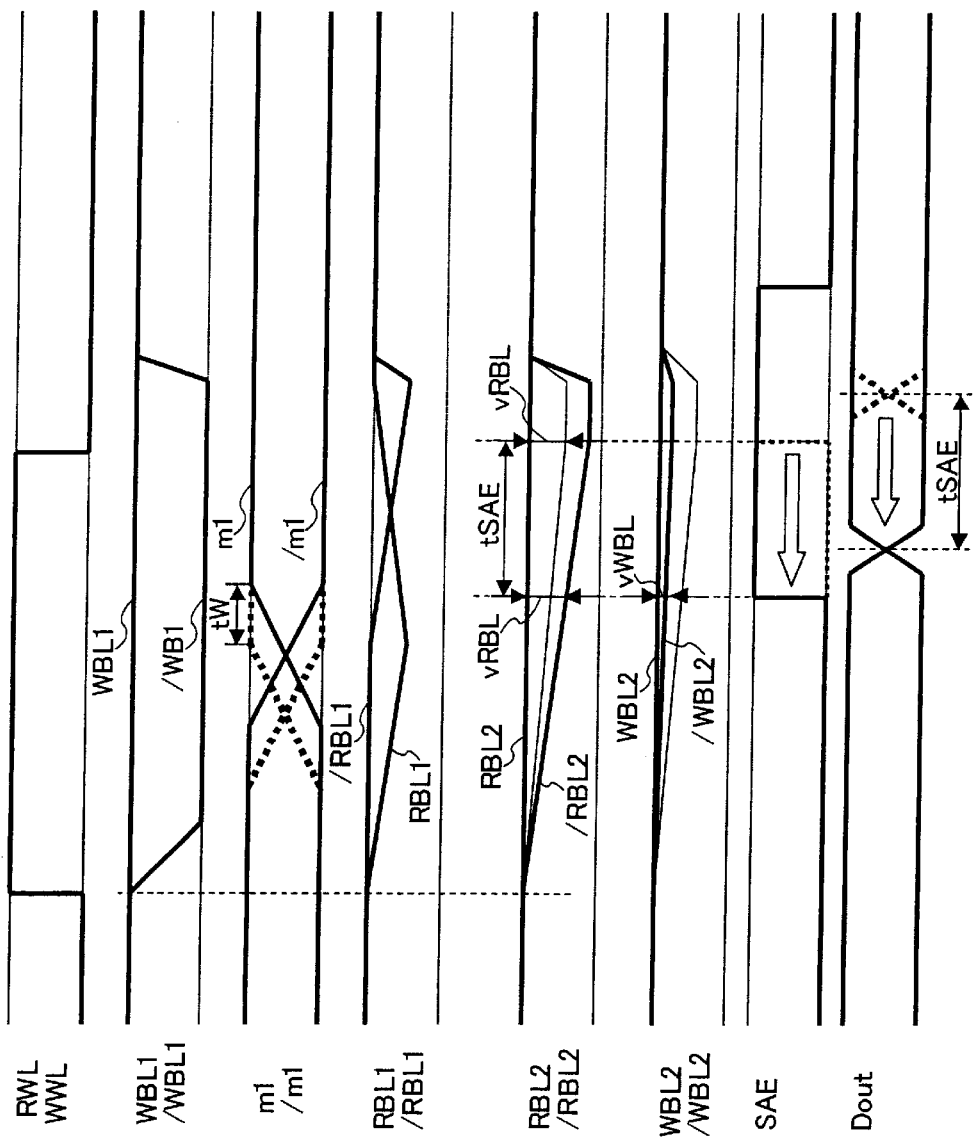
FIG. 2 is a timing chart for signals at the individual portions in the configuration shown FIG. 1.

FIG. 2 is a timing chart for signals at the individual portions in FIG. 1 during writing and reading operations.

FIG. 2 illustrates a case of read/write simultaneous access where the memory cell 1a2 and the memory cell 1b2 are conducting a writing operation and a reading operation, respectively. Accordingly, the read word line RWL and the write word line WWL are driven at the same timing.

SAE (Sense Amp Enable) is a timing signal for driving the sense amplifiers SA1 and SA2.

In FIG. 2, waveforms illustrated by the solid lines indicate the present invention where the gate width of the write access transistors 21 is smaller than that of the read access transistors 3, while waveforms illustrated by the fainter lines indicate the conventional case where the gate width of the write access transistors 2 is the same as that of the read access transistors 3.

On commencing the reading/writing operations, firstly, the write word line WWL and the read word line RWL are activated (Logic "L" changes into logic "H").

Regarding the memory cell 1a2, data to be written has been inputted to the write bit lines WBL1 and /WBL1 from the outside, and therefore on activating the write word line WWL, the information on the write bit line WBL1 and /WBL1 starts to be written on the memory cell. In FIG. 2, this is the case where the write bit lines WBL1 and /WBL1 are in the state of logic "H" and logic "L", respectively, which is the case of the logic "H" writing. As a result, the storage nodes m1 and /m1 respectively are rewritten from the state of logic "L" and logic "H" to the state of logic "H" and logic "L", namely, from the logic "L" holding state to the logic "H" holding state.

However, since the gate width of the write access transistors 21 is set smaller, the amount of current flowing through the write access transistors 21 is reduced, so that a time required for rewriting the storage nodes m1 and /m1 is increased by tW compared with the conventional case.

Regarding this operation, since the storage nodes m1 and /m1 have not been rewritten immediately after the activation of the word line, the data "L" and "H", which the storage nodes m1 and /m1 keep originally, start to be read out onto the read bit lines RBL1 and /RBL1, respectively. After that, the instant when the storage nodes m1 and /m1 have been rewritten, the written data starts to be read out. Since the operation conducted is a writing operation, the unstable operation by the read bit lines RBL1 and /RBL1 is disregarded completely.

Next, regarding the memory cell 1b2, this memory cell conducts a reading operation. Therefore, the instant when the read word line RWL is activated, the data "H" and "L", which the storage nodes m2 and /m2 keep originally, are read out onto the bit lines RBL2 and /RBL2, respectively. At this moment, since the write word line WWL also is activated, the kept data is transferred to the write bit lines WBL2 and /WBL2. However, since the gate width of the write access transistors 21 is set smaller, currents flowing from the storage nodes m2 and /m2 to the write bit lines WBL2 and /WBL2, respectively, are reduced. Accordingly, a variation in voltage (solid line) of the write bit lines WBL2 and WBL2 becomes smaller than that in the conventional case (fainter line).

Concurrently with the activation of the read word line RWL, the data in the storage nodes m2 and /m2 are read out onto the read bit lines RBL2 and /RBL2. However, since a current for reading out data from the storage nodes m2 and /m2, i.e., a driving capability of the inverters 4 is constant but the amount of currents flowing to the write bit lines WBL2 and /WBL2 is reduced, the amount of current supplied to the read bit lines RBL2 and /RBL2 is increased, whereby a voltage magnitude of the read bit lines RBL2 and /RBL2 can be increased. Now, assuming that a difference in potentials at the time the sense amplifier SA2 conducts amplification between the read bit lines RBL2 and /RBL2 is vRBL, a time duration required for reaching the vRBL is reduced by tSAE by the write access transistors 21 having a smaller gate width. Therefore, as for the access time, speeding up can be realized by the time duration of tSAE.

In this embodiment, although the gate width of the write access transistors is decreased, the gate width of the read access transistors may be increased over that of the write access transistors conversely. However, the method for decreasing the gate width of the write access transistors is more effective in terms of the cost, because the decrease in the gate width leads to a decrease in the chip area.

In addition, a gate length may be changed instead of the gate width. In this case, the gate length of the write access transistors is set longer than that of the read access transistors to realize the present invention.

Furthermore, a thickness of a gate oxide film may be changed in the manufacturing process to realize the present invention. In this case, the thickness of the gate oxide film in the write access transistors is increased, or the thickness of the gate oxide film in the read access transistors is decreased to realize the present invention.

Embodiment 2

Figure 3:
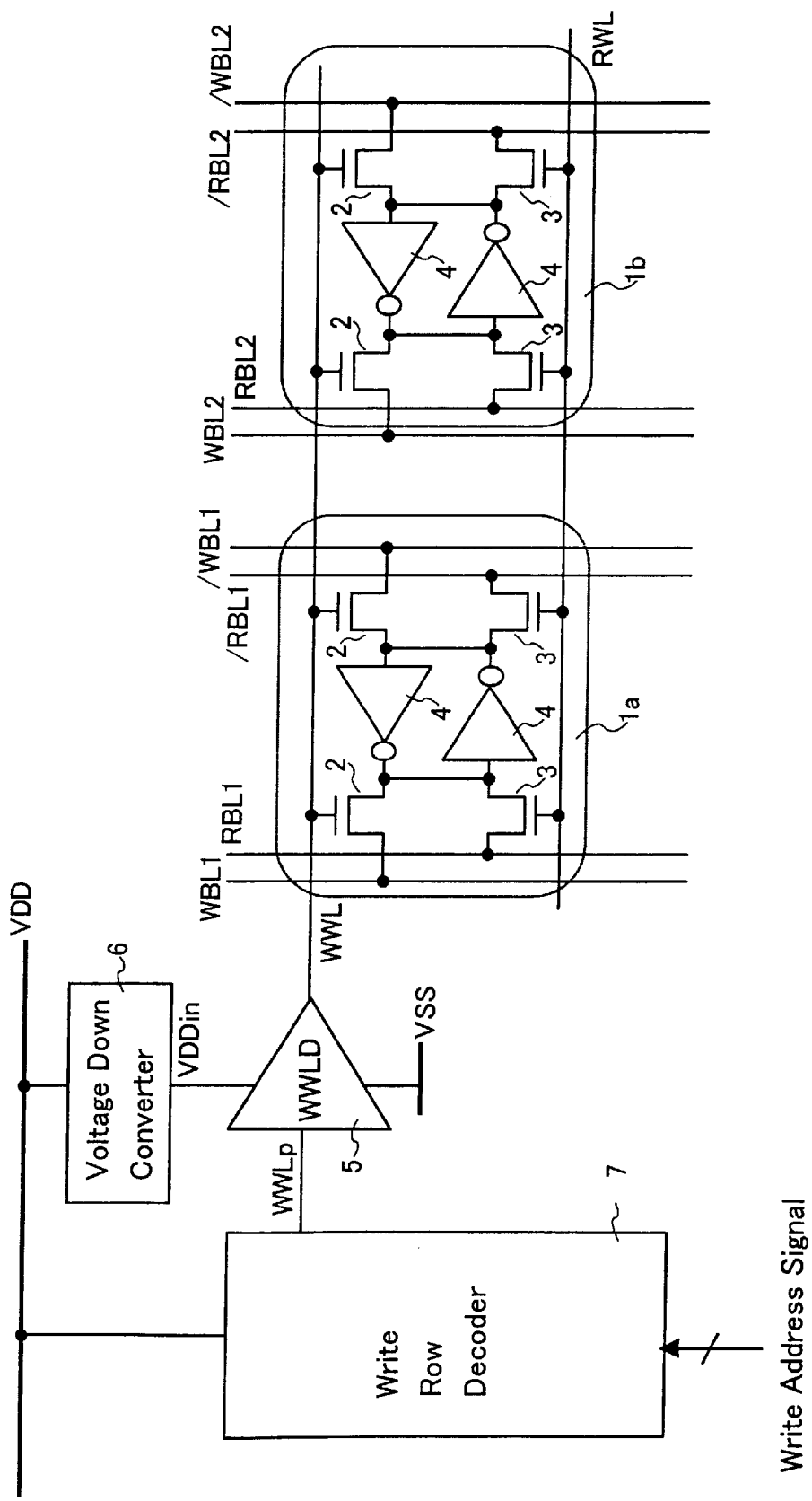
FIG. 3 is a circuit block diagram showing a configuration of memory cells and their peripheral circuit in a dual-port SRAM according to Embodiment 2 of the present invention.

FIG. 3 is a circuit block diagram showing a configuration of memory cells and their peripheral circuit in a dual-port SRAM according to Embodiment 2 of the present invention.

According to this embodiment, speeding up of the reading operation can be realized by controlling a logic "H" level of a word line.

Figure 8:
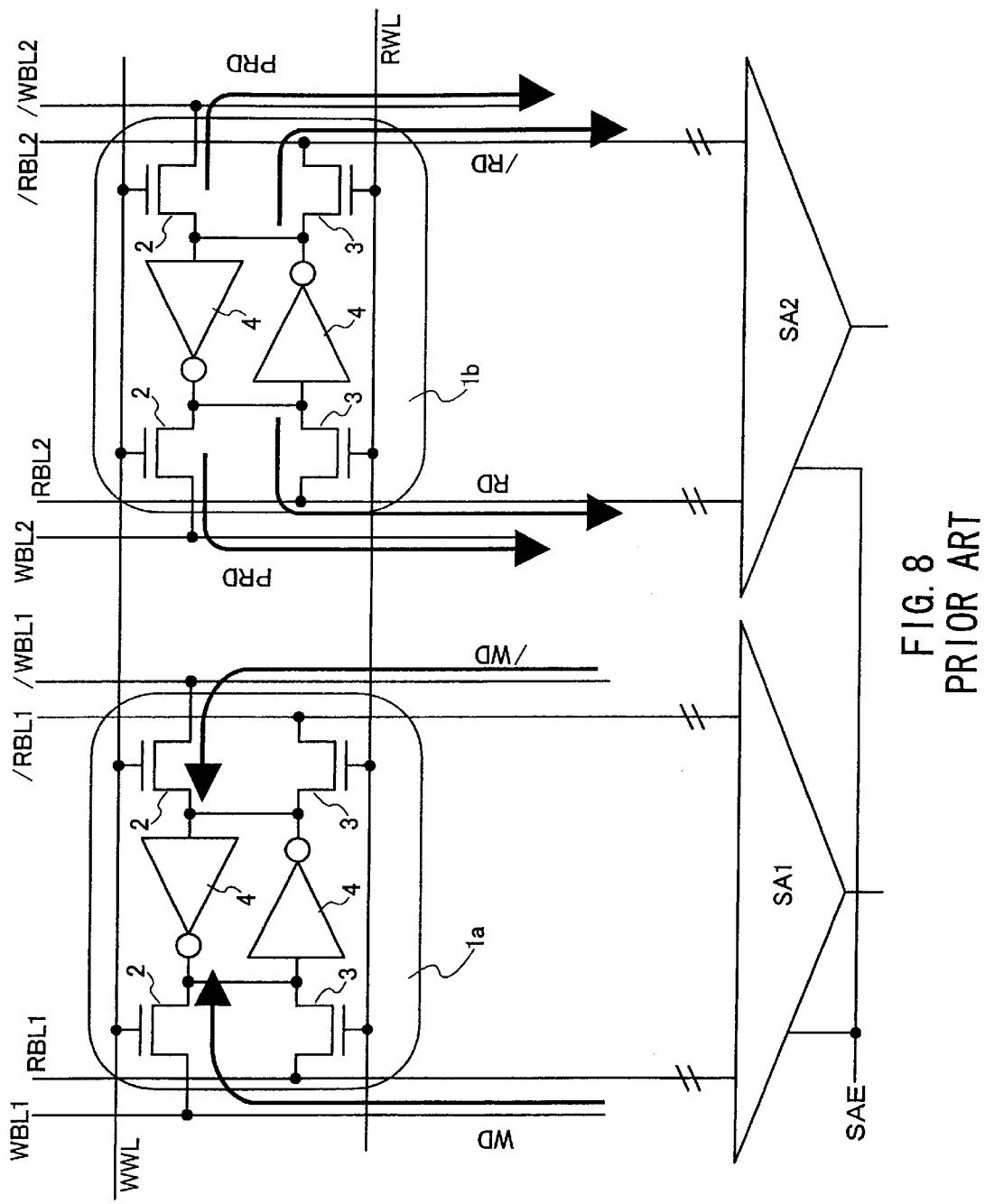
FIG. 8 is a circuit diagram showing a configuration of memory cells in the conventional dual-port SRAM.

In FIG. 3, reference numeral 5 denotes a write word line driver (WWLD) for driving a write word line WWL, 6 denotes a voltage down converter that generates a desired voltage VDDin (VDDin<VDD) from a power supply voltage VDD so as to supply the voltage VDDin to the write word line driver 5, and 7 denotes a write row decoder for controlling the write word line driver 5. Note here that constituents that are the same as those in FIG. 8 have been given the same reference numerals and their explanation has been omitted.

The write row decoder 7 receives an inputted write address signal and controls a write word line driver 5 corresponding to a write word line as a target to be accessed. Since VDD is supplied to the write row decoder 7, a logic "H" level of a signal WWLp outputted from the write row decoder 7 is equal to VDD. Since VDDin is supplied to the write word line driver 5 from the voltage down converter 6, a logic "H" level of the write word line WWL, which the write word line driver 5 receiving the signal WWLp outputs, is equal to VDDin. In this way, the write word line driver 5 has the function of converting a voltage of an input/output signal, in addition to the function of driving the write word line.

Figure 4:
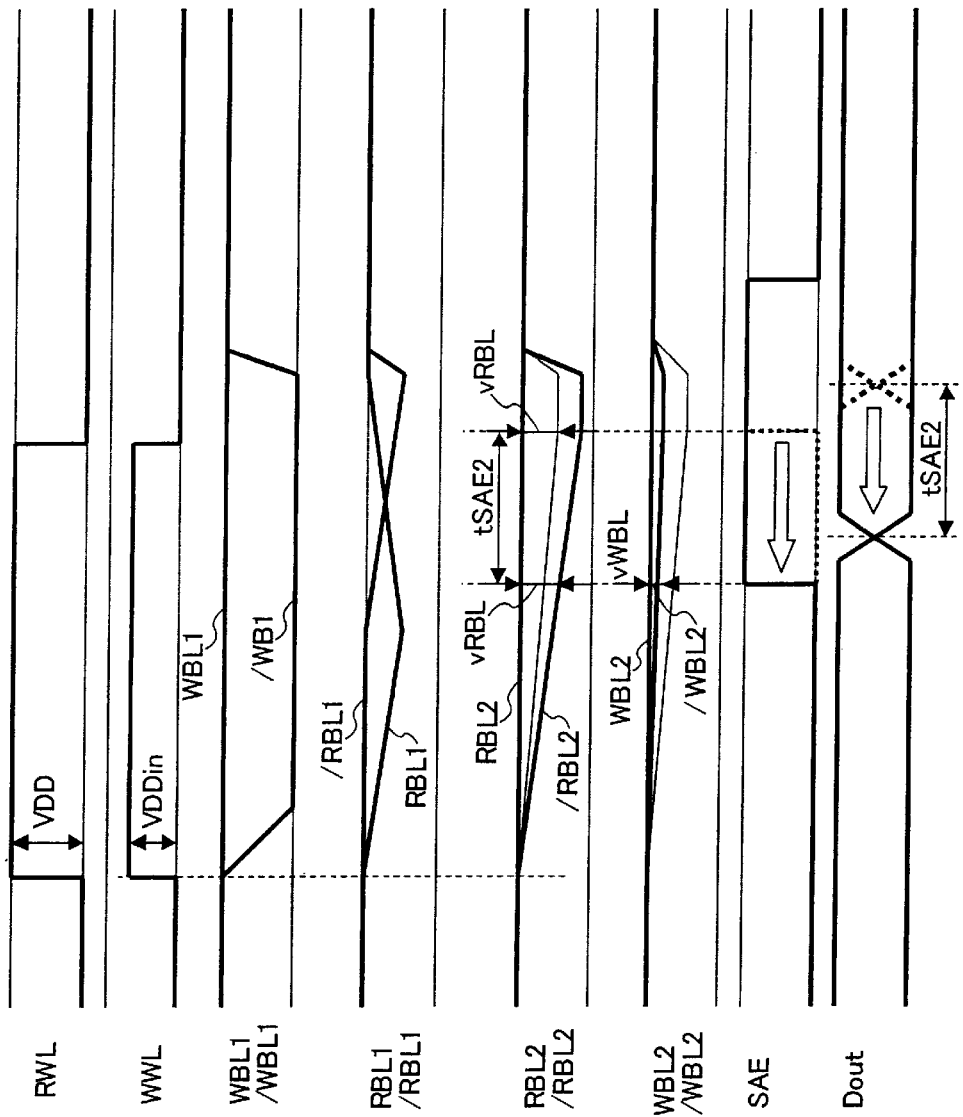
FIG. 4 is a timing chart for signals at the individual portions in the configuration shown in FIG. 3.

FIG. 4 is a timing chart for signals at the individual portions in the configuration shown in FIG. 3.

In FIG. 4, the write word line driver 5 controls the logic "H" level of the write word line WWL to be VDDin. Now, regarding the write access transistor 2, since the potential of the write word line WWL is VDDin, i.e., the gate potential of the write access transistor 2 is VDDin, a voltage across the gate/source of the write access transistor 2 becomes VDDin. Accordingly, compared with the conventional case where the logic "H" level of the write word line WWL is VDD, the gate voltage is decreased by $\Delta Vgs$ (=VDD−VDDin). As a result, the amount of current flowing through the write access transistor 2 is decreased. Now, regarding the memory cell 1b, as shown in FIG. 4, the inclination of the amplitude variation in the write bit lines WBL2 and /WBL2 is decreased, and the thus decreased current is supplied to the read bit lines, which increases the inclination of the amplitude variation in the read bit lines RBL2 and /RBL2. As a result, a time duration required for reaching the voltage vRBL, which is necessary for operating the sense amplifier SA2, is reduced by tSAE2, so that the access time can be reduced by tSAE2.

Figure 5:
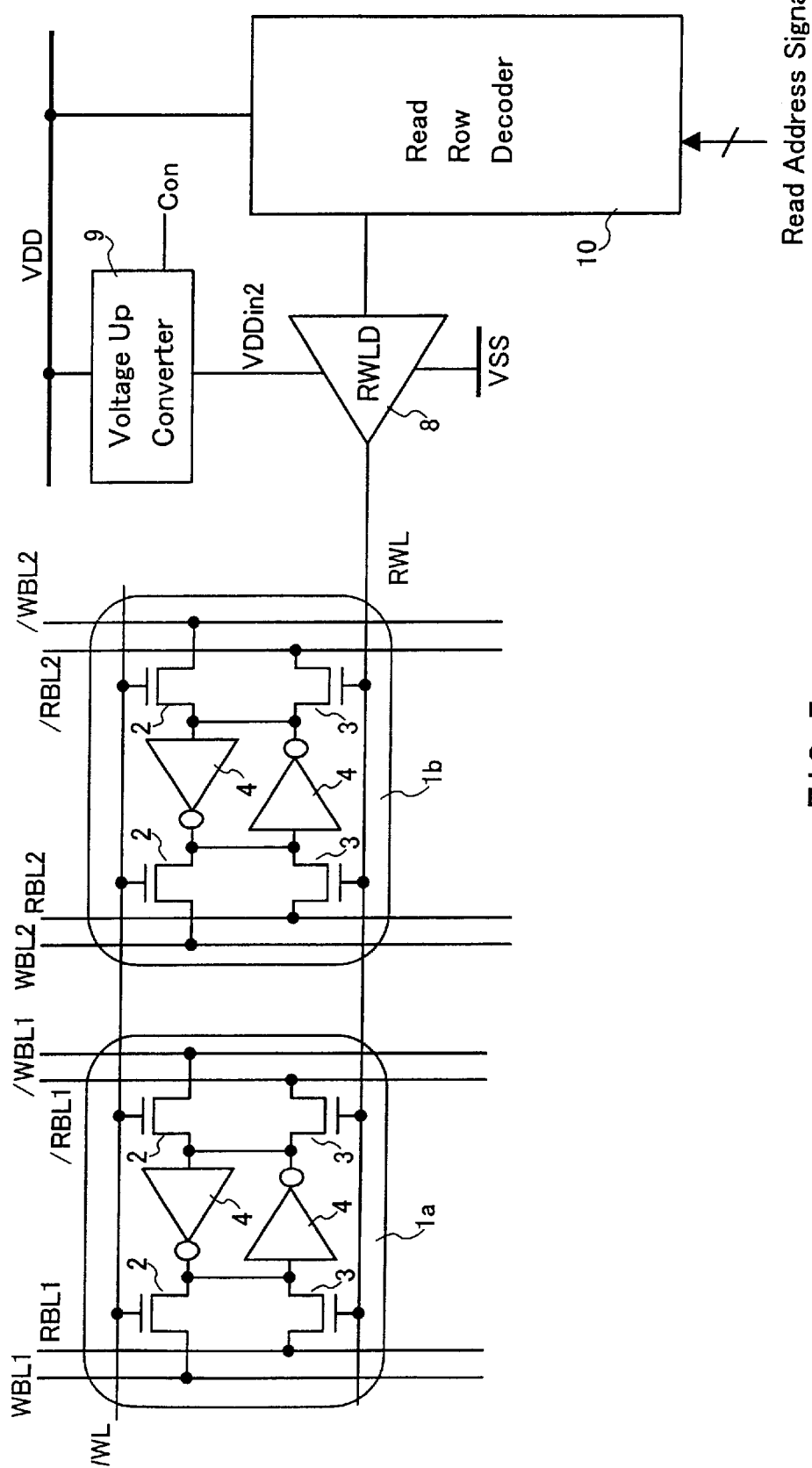
FIG. 5 is circuit block diagram showing a modification of memory cells and their peripheral circuit in a dual-port SRAM according to Embodiment 2 of the present invention.

Contrary to FIG. 3, FIG. 5 is a circuit block diagram showing a configuration where the voltage of the read word line RWL is increased. Reference numeral 8 denotes a read word line driver (RWLD) for driving the read word line, 9 denotes a voltage up converter that receives a control signal Con and generates a control voltage from a power supply voltage VDD so as to supply the control voltage to the read word line driver 8, and 10 denotes a read row decoder. The voltage up converter 9 converts a voltage supplied to the read word line driver 8 from VDD into VDDin2 (VDDin2>VDD) so as to control a logic "H" level of the read word line RWL into VDDin2, whereby a voltage across gate/source of the read access transistor 3 can be increased. Accordingly, the amount of current flowing through the read access transistor 3 is increased, so that speeding up of the reading operation can be realized.

Although this embodiment is the same as Embodiment 1 in that the capability of the access transistors is controlled, the memory cells are not changed directly in this embodiment. According to this embodiment, in order to realize the present invention, the voltage down converter 6 or the voltage up converter 9 for supplying a decreased voltage or an increased voltage to the write word line driver 5 or the read word line driver 8 is added to the outside of the memory block (i.e., the whole memory including the memory cells and the peripheral circuit) that has been completed. Thus, this embodiment has the advantage of being applicable to an existing library with a small number of steps.

Embodiment 3

Figure 6:
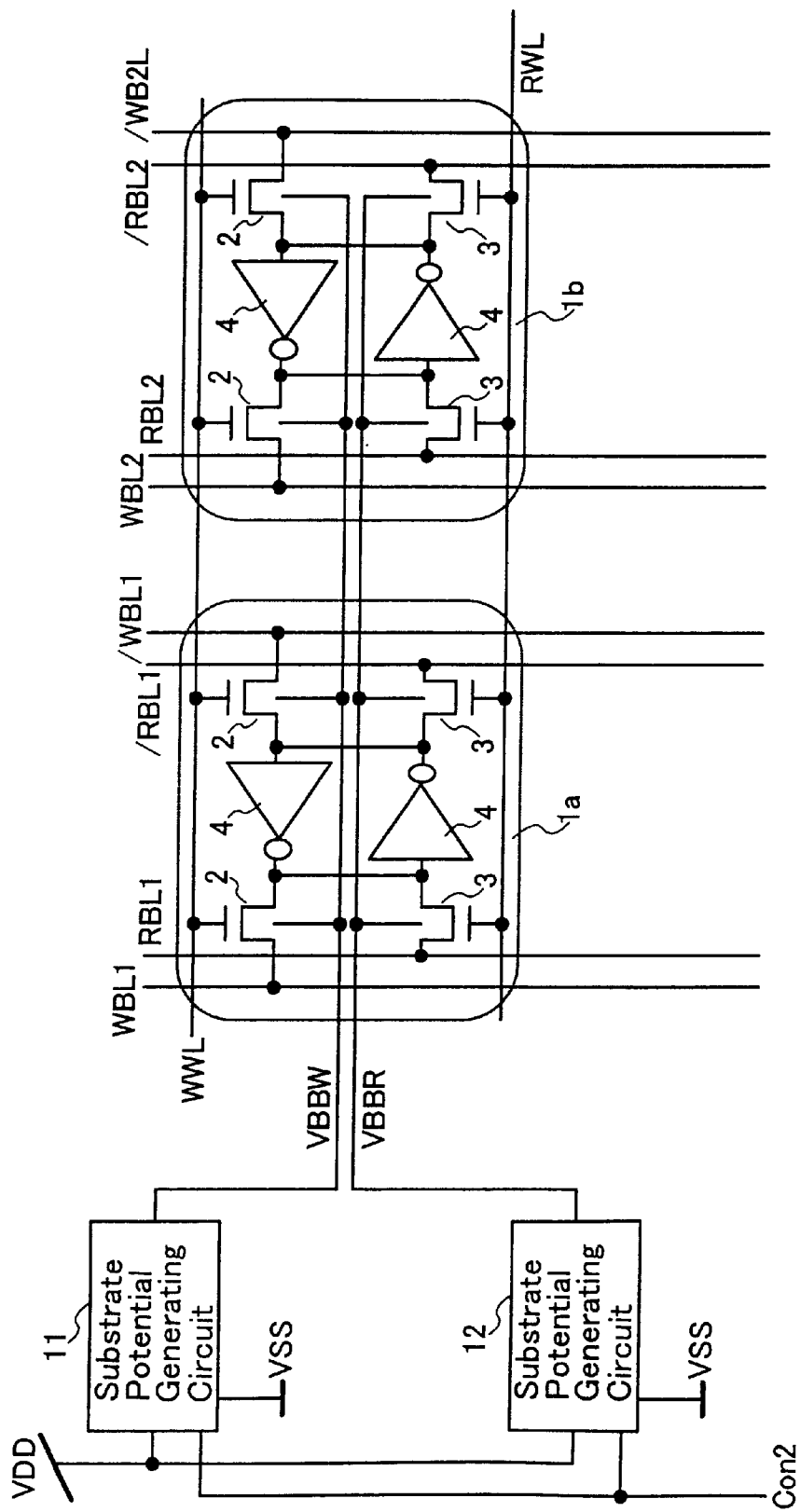
FIG. 6 shows a circuit block diagram showing a configuration of memory cells and their peripheral circuit in a dual-port SRAM according to Embodiment 3 of the present invention.

FIG. 6 shows a circuit block diagram showing a configuration of memory cells and their peripheral circuit in a dual-port SRAM according to Embodiment 3 of the present invention.

According to this embodiment, speeding up of a reading operation can be realized by controlling a threshold value of access transistors.

In FIG. 6, reference numerals 11 and 12 denote substrate potential generating circuits that control substrate potentials of the access transistors based on the power supply voltage VDD, the ground potential VSS and a control signal Con2.

Since a threshold voltage Vt of a MOS transistor is altered by changing the substrate potential, the current-carrying capability thereof can be altered. According to this embodiment, by making use of this phenomenon, a substrate potential VBBW of a write access transistor 2 is shifted to a lower potential side than the ground potential VSS in the conventional case (VBBW<VSS). Thereby, a threshold value Vt of the write access transistor 2 is increased apparently, so that the current-carrying capability of the write access transistor 2 is decreased. As a result, the read access time can be reduced.

Conversely, regarding a read access transistor 3, a substrate potential VBBR is shifted to a higher potential side than the ground potential VSS in the conventional case, whereby a threshold value of the read access transistor is decreased apparently so as to enhance the current-carrying capability thereof As a result, the read access time can be reduced.

Note here that a threshold value of a transistor can be altered in the manufacturing process thereof (i.e., according to a multi Vt process). That is to say, diffusion conditions are modified so that the threshold value of the write access transistor is set higher than that of the read access transistor, whereby the same effect as in the above can be obtained.

Embodiment 4

Figure 7A:
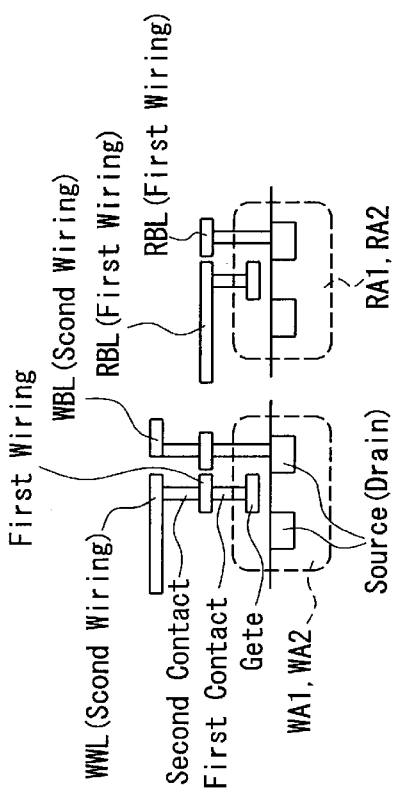
FIG. 7A is a circuit diagram showing a configuration of a memory cell and its accompanying parasitic resistance in a dual-port SRAM according to Embodiment 4 of the present invention.

FIG. 7A is a circuit diagram showing a configuration of a memory cell and its accompanying parasitic resistance in a dual-port SRAM according to Embodiment 4 of the present invention.

In FIG. 7A, WA1 and WA2 respectively are write access transistors connected to write bit lines WBL and /WBL. RA1 and RA2 respectively are read access transistors connected to read bit lines RBL and /RBL. These access transistors make up the memory cell together with a pair of inverters 4. R1 to R14 denote parasitic resistance generated at each of the source, drain and gate of these access transistors.

According to this embodiment, the parasitic resistance components of the read path and the write path are differentiated intentionally from each other so as to speed up the reading operation.

Figure 7B:
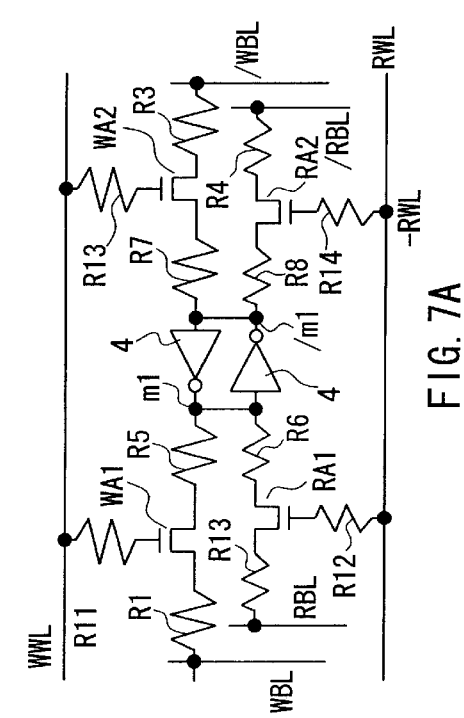
FIG. 7B is a plan view showing a configuration of a semiconductor in which the number of contacts used for connecting the write word line WWL and gate electrodes of the write access transistors WA1 and WA2 shown in FIG. 7A in parallel is made smaller than the number of contacts used for connecting the read word line RWL and gate electrodes of the read access transistors RA1 and RA2 in parallel, so that the resistance components of the read path and the write path are differentiated.

As shown in FIG. 7B, the number of contacts used for connecting the write word line WWL and the gate electrodes of write access transistors WA1 and WA2 in parallel is made smaller than the number of contacts used for connecting the read word line RWL and the gate electrodes of the read access transistors RA1 and RA2 in parallel, so that the parasitic resistance on the gate side can be made R11>R12 and R13>R14.

In addition, the number of contacts used for connecting the write bit line WBL and a source (or drain) electrode of the write access transistor WA1 and for connecting the write bit line /WBL and a source (drain) electrode of the write access transistor WA2 is made smaller than each of the numbers of contacts used for connecting the read bit line RBL and a source (or drain) of the read access transistor RA1 and for connecting the read bit line /RBL and the read access transistor RA2. Thus, the parasitic resistance on the source or the drain side can be made R1>R2 and R3>R4.

Furthermore, as for the connection between the write access transistor WA1 or WA2 and the storage nodes m1 or /m1 and the connection between the read access transistor RA1 or RA2 and the storage nodes m1 or /m1, the parasitic resistance thereof can be made R5>R6 and R7>R8 according to the same manner as in the above.

Figure 7C:
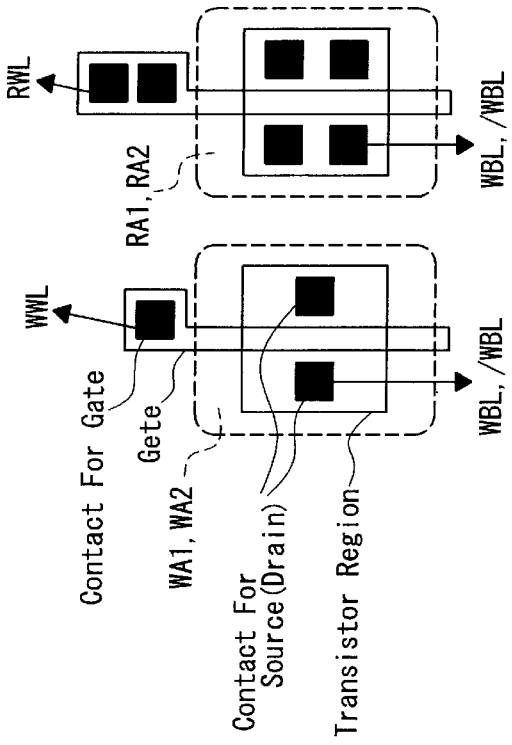
FIG. 7C is a cross-sectional view showing a configuration of a semiconductor in which the write word line WWL (a second line) shown in FIG. 7A is arranged at an upper layer than the read word line RWL (a first line) so that more contacts to be connected in series with the gate electrodes of the write access transistors WA1 and WA2 are required, whereby the resistance components of the read path and the write path are differentiated.

Alternatively, as shown in FIG. 7C, the number of contacts is differentiated by modifying a layer structure, whereby the parasitic resistance components of the read path and the write path are differentiated.

That is to say, the write word line WWL (a second line) is arranged at an upper layer relative to the read word line RWL (a first line), so that more contacts to be connected in series with the gate electrodes of the write access transistors WA1 and WA2 are required. As a result, the parasitic resistance thereof can be made R11>R12 and R13>R14.

Similarly, this method is applicable to the bit lines in such a manner that the write bit lines WBL and /WBL (a second line) are arranged at an upper layer relative to the read bit lines RBL and /RBL (a first line), so that the parasitic resistance thereof can be made R1>R2 and R3>R4.

Note here that the above-described method employs a difference in number of the contacts as a means for controlling the parasitic resistance components. However, the line length of the word lines and the bit lines may be differentiated simply.

Figure 7D:
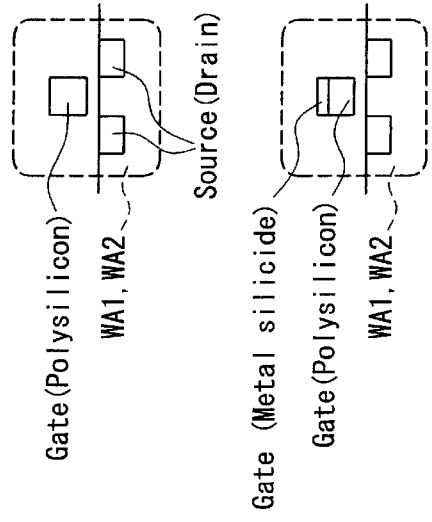
FIG. 7D is a cross-sectional view showing a configuration of a semiconductor in which the gate electrodes of the read access transistor RA1 and RA2 in FIG. 7A have a silicide structure where metal silicide as a resistance component is overlaid on polysilicon, whereby the resistance components of the read path and the write path are differentiated.

Alternatively, as shown in FIG. 7D, the gate electrodes of the read access transistor RA1 and RA2 may have a silicide structure where metal silicide as a resistance component is overlaid on polysilicon, whereby the parasitic resistance components of the read path and the write path can be differentiated.

In addition, the source and drain portions may have a salicide structure.

As described above, according to the present invention, the capability of the write access path and the read access path are differentiated from each other so that the write access is delayed within a range capable of finishing the operation. As a result, the read access can be speeded up.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory comprising ports, each of which exclusively functions as a read port or a write port, and a memory cell including a pair of first transistors, a pair of second transistors and a pair of first inverters connected like a ring, and coupled to the first and second transistors, the first transistors being used for a writing operation and the second transistors being used for a reading operation, wherein a first current flowing through the first transistors is less than a second current flowing through the second transistors.

2. The semiconductor memory according to claim 1, wherein a difference between the first current and the second current is determined by the first transistors and the second transistors.

3. The semiconductor memory according to claim 1, wherein a gate width of the first transistors is smaller than a gate width of the second transistors.

4. The semiconductor memory according to claim 1, wherein a gate length of the first transistors is longer than a gate length of the second transistors.

5. The semiconductor memory according to claim 1, wherein a threshold voltage of the first transistors is higher than a threshold voltage of the second transistors.

6. The semiconductor memory according to claim 1, wherein a thickness of a gate oxide film of the first transistors is larger than a thickness of a gate oxide film of the second transistors.

7. The semiconductor memory according to claim 1, wherein a first gate-source voltage of the first transistors during operation is smaller than a second gate-source voltage of the second transistors during operation.

8. The semiconductor memory according to claim 7 further comprising at least one of a first voltage conversion circuit that generates the first gate-source voltage and a second voltage conversion circuit that generates the second gate-source voltage.

9. The semiconductor memory according to claim 1, wherein a first source-substrate voltage of the first transistors is larger than a second source-substrate voltage of the second transistors.

10. The semiconductor memory according to claim 9 further comprising at least one of a third voltage conversion circuit that generates the first source-substrate voltage and a fourth voltage conversion circuit that generates the second source-substrate voltage.

11. The semiconductor memory according to claim 1, wherein a difference between the first current and the second current is determined by a first resistance component in a write path and a second resistance component in a read path.

12. The semiconductor memory according to claim 11, wherein the first resistance component is determined by the number of first contacts that connect a first gate electrode of the first transistors and a first line and are arranged in parallel, the second resistance component is determined by the number of second contacts that connect a second gate electrode of the second transistors and a second line and are arranged in parallel, and the number of the first contacts is smaller than the number of the second contacts.

13. The semiconductor memory according to claim 11, wherein the first resistance component is determined by the number of third contacts that connect a first source electrode or a first drain electrode of the first transistors and a third line and are arranged in parallel, the second resistance component is determined by the number of fourth contacts that connect a second source electrode or a second drain electrode of the second transistors and a fourth line and are arranged in parallel, and the number of the third contacts is smaller than the number of the fourth contacts.

14. The semiconductor memory according to claim 12, wherein the first line connected to the first gate electrode of the first transistors is arranged at an upper layer relative to the second line connected to the second gate electrode of the second transistors.

15. The semiconductor memory according to claim 13, wherein the third line connected to the first drain electrode of the first transistors is arranged at an upper layer relative to the fourth line connected to the second drain electrode of the second transistors.

16. The semiconductor memory according to claim 11, wherein the first resistance component is determined by a third resistance of a first gate electrode of the first transistors, the second resistance component is determined by a fourth resistance of a second gate electrode of the second transistors, and the third resistance is larger than the fourth resistance.

17. The semiconductor memory according to claim 11, wherein the first resistance component is a fifth resistance of a first source electrode or a first drain electrode of the first transistors, the second resistance component is a sixth resistance of a second source electrode or a second drain electrode of the second transistors, and the fifth resistance is larger than the sixth resistance.

18. The semiconductor memory according to claim 1, wherein a second gate electrode of the second transistors has a silicide structure.

19. The semiconductor memory according to claim 1, wherein a second source electrode or a second drain electrode of the second transistors has a salicide structure.

* * * * *